(12) United States Patent
Yin et al.

(10) Patent No.: US 10,615,952 B1
(45) Date of Patent: Apr. 7, 2020

(54) SYNCHRONIZATION METHOD AND WIDE AREA SYSTEM PROTECTION APPARATUS

(71) Applicants: STATE GRID JIANGSU ELECTRIC POWER CO., LTD, Nanjing, Jiangsu (CN); NARI TECHNOLOGY CO., LTD, Nanjing, Jiangsu (CN); NANJING CHSCOM Electrical Technology Co., Ltd., Nanjing (CN)

(72) Inventors: Jijun Yin, Jiangsu (CN); Qing Chen, Jiangsu (CN); Zheng Wu, Jiangsu (CN); Xiao Lu, Jiangsu (CN); Jianyu Luo, Jiangsu (CN); Haifeng Li, Jiangsu (CN); Xueming Li, Jiangsu (CN); Li Zhang, Jiangsu (CN); Feng Xue, Jiangsu (CN); Kaiming Luo, Jiangsu (CN); Lin Liu, Jiangsu (CN); Yunsong Yan, Jiangsu (CN); Jianfeng Ren, Jiangsu (CN); Haifeng Xia, Jiangsu (CN)

(73) Assignees: STATE GRID JIANGSU ELECTRIC POWER CO., LTD., Nanjing (CN); NARI TECHNOLOGY CO., LTD, Nanjing (CN); NANJING CHSCOM ELECTRICAL TECHNOLOGY CO., LTD., Nanjing (CN)

( * ) Notice: Subject to any disclaimer, the term of this patent is extended or adjusted under 35 U.S.C. 154(b) by 0 days.

(21) Appl. No.: 16/409,639

(22) Filed: May 10, 2019

(30) Foreign Application Priority Data

Feb. 1, 2019 (CN) .......................... 2019 1 0103517

(51) Int. Cl.
*H04L 7/00* (2006.01)
*H04W 56/00* (2009.01)
(Continued)

(52) U.S. Cl.
CPC .............. *H04L 7/0008* (2013.01); *H03L 7/06* (2013.01); *H04L 7/0041* (2013.01); *H04W 56/001* (2013.01); *G01S 19/37* (2013.01)

(58) Field of Classification Search
CPC ....... H04L 7/0008; H04L 7/0041; H03L 7/06; H04W 56/001; G01S 19/37
See application file for complete search history.

(56) References Cited

U.S. PATENT DOCUMENTS

| 6,330,236 B1 * | 12/2001 | Ofek | ...................... | H04J 3/0697 370/369 |
| 7,103,124 B1 * | 9/2006 | Lindskog | .............. | H04J 3/0667 375/354 |

(Continued)

*Primary Examiner* — Freshteh N Aghdam
(74) *Attorney, Agent, or Firm* — Arent Fox LLP

(57) ABSTRACT

Provided are a synchronization method, a wide area system protection apparatus, a plant station and a computer readable storage medium. The method includes: sending to a second plant station a first data frame that includes a sequence number p and a sending timestamp of the first data frame; receiving a second data frame sent by the second plant station, and recording a receiving timestamp of the second data frame, the second data frame including a sequence number q of the second data frame, a sending timestamp of the second data frame and a receiving timestamp of the first data frame, and the first data frame being adjacent to the second frame on the second plant station; calculating a time phase difference and a crystal oscillator frequency deviation between the first plant station and the second plant station; and adjusting time and a clock frequency of the first plant station.

19 Claims, 4 Drawing Sheets

(51) Int. Cl.
*H03L 7/06* (2006.01)
*G01S 19/37* (2010.01)

(56) References Cited

U.S. PATENT DOCUMENTS

| | | | |
|---|---|---|---|
| 2009/0034459 A1* | 2/2009 | Shousterman | H04L 12/189 370/329 |
| 2013/0250850 A1* | 9/2013 | Lin | H04W 56/001 370/328 |
| 2016/0285616 A1* | 9/2016 | Dionne | G01R 19/2513 |
| 2018/0139709 A1* | 5/2018 | Shenoi | H04J 3/065 |

* cited by examiner

SYNCHRONIZATION METHOD AND WIDE AREA SYSTEM PROTECTION APPARATUS

CROSS-REFERENCES TO RELATED APPLICATIONS

This application claims priority to a Chinese patent application No. 201910103517.6 filed on Feb. 1, 2019, the disclosure of which is incorporated herein by reference in its entirety.

TECHNICAL FIELD

Embodiments of the present invention relate to the technical field of power systems, and particularly to a synchronization method, a wide area system protection apparatus, a plant station and a computer readable storage medium.

BACKGROUND

A wide area system protection apparatus is a control device arranged in a power plant or a substation to ensure the stability of a power system when encountering large disturbances. The wide area system protection apparatus realizes machine switching, load shedding, rapid output reduction, urgent rising or descending of DC power and other functions, and is an important facility of keeping safe and stable operation of the power system. A network topology framework of the wide area system protection apparatus generally includes two or more plant stations in communications connection, thereby realizing stable control of regional or a greater range of power systems. Therefore, in order to avoid oscillation problems of a power grid at different frequency bands and facilitate the malfunction analysis, the plant stations need to be kept synchronous in time.

An existing time synchronization method of the system protection apparatus is generally based on a global positioning system (GPS) mode, or a synchronous digital hierarchy (SDH) mode. However, in the GPS mode, once GPS is lost by some plant stations, a global clock synchronization function will be lost, and the related system protection control function will be blocked. In the SDH mode, a special switch that supports SDH transmission and a time synchronization device that supports an IEEE-1588 protocol should be equipped according to an IEEE-1588 time synchronization protocol, which has expensive cost and is not practical.

SUMMARY

The present disclosure provides a synchronization method and device for a wide area system protection apparatus, a plant station and a topology framework, so as to realize wide area time synchronization for the system protection apparatus without changing a physical framework and channel configuration of the existing system protection apparatus, thereby saving production cost.

In a first aspect, embodiments of the present invention provide a synchronization method for a wide area system protection apparatus. A network topology framework of the wide area system protection apparatus at least includes a first plant station and a second plant station. The first plant station sends a data frame to the second plant station at a regular time interval, and the second plant station sends a data frame to the first plant station at a regular time interval. The method includes:

sending, by the first plant station, a first data frame to the second plant station, where the first data frame includes a sequence number p of the first data frame and a sending timestamp $T_{st[p]}$ of the first data frame;

receiving, by the first plant station, a second data frame sent by the second plant station, and recording a receiving timestamp $T_{sr[q]}$ of the second data frame, where the second data frame includes a sequence number q of the second data frame, a sending timestamp $T_{mt[q]}$ of the second data frame and a receiving timestamp $T_{mr[p]}$ of the first data frame, and the first data frame is adjacent to the second frame on the second plant station;

calculating, by the first plant station, a time phase difference $\Delta s$ and a crystal oscillator frequency deviation $\Delta f_p$ between the first plant station and the second plant station according to the sending timestamp $T_{st[p]}$ of the first data frame, the receiving timestamp $T_{mr[p]}$ of the first data frame, the sending timestamp $T_{mt[q]}$ of the second data frame and the receiving timestamp $T_{sr[q]}$ of the second data frame; and adjusting, by the first plant station, time of the first plant station according to the calculated time phase difference $\Delta s$, and adjusting a clock frequency of the first plant station according to the calculated crystal oscillator frequency deviation $\Delta f_p$.

In a second aspect, embodiments of the present invention further provide a wide area system protection apparatus. The wide area system protection apparatus includes a first plant station and a second plant station.

The first plant station is configured to: send a first data frame to the second plant station, where the first data frame comprises a sequence number of the first data frame and a sending timestamp of the first data frame; receive a second data frame sent by the second plant station and record a receiving timestamp of the second data frame, where the second data frame includes a sequence number of the second data frame, a sending timestamp of the second data frame and a receiving timestamp of the first data frame, and the first data frame is adjacent to the second frame on the second plant station; calculate a time phase difference and a crystal oscillator frequency deviation between the first plant station and the second plant station according to the sending timestamp of the first data frame, the receiving timestamp of the first data frame, the sending timestamp of the second data frame and the receiving timestamp of the second data frame; and adjust time of the first plant station according to the calculated time phase difference and adjust a clock frequency of the first plant station according to the calculated crystal oscillator frequency deviation.

In a third aspect, embodiments of the present invention further provide a network topology framework of a wide area system protection apparatus. The topology framework includes a first plant station and a second plant station. The first plant station sends a data frame to the second plant station at a regular time interval, and the second plant station sends a data frame to the first plant station at a regular time interval. The first plant station includes the device having the wide area synchronization function in the second aspect of embodiments of the present invention.

In a fourth aspect, embodiments of the present invention further provide a plant station, including: one or more processors; and a memory, configured to store one or more programs.

When the one or more programs are executed by the one or more processors, the one or more processors realize the synchronization method for the wide area system protection apparatus in the first aspect of embodiments of the present invention.

In a fifth aspect, embodiments of the present invention further provide a computer readable storage medium which stores a computer program. The computer program, when executed by the processors, realizes any synchronization method of the wide area system protection apparatus in the first aspect of embodiments of the present invention.

According to the present disclosure, the sending timestamp $T_{st[p]}$ of the first data frame, the receiving timestamp $T_{mr[p]}$ of the first data frame, the sending timestamp $T_{mt[q]}$ of the second data frame and the receiving timestamp $T_{sr[q]}$ of the second data frame are acquired by the first plant station, and the time phase difference $\Delta s$ and the crystal oscillator frequency deviation $\Delta f_p$ between the first plant station and the second plant station are calculated; and the time of the first plant station is adjusted according to the time phase difference $\Delta s$, and the clock frequency of the first plant station is adjusted according to the crystal oscillator frequency deviation $\Delta f_p$. The timestamp information is transmitted in an SDH 2M channel by means of the data frame independently of the GPS system, it does not need to provide an external clock source by building an SDH-based IEEE-1588 time synchronization system, so the wide area time synchronization of the system protection apparatus is realized without changing the physical framework and channel configuration of the existing system protection apparatus, saving the production cost.

DETAILED DESCRIPTION

The present invention will be further described below in detail in combination with drawings and embodiments. It should be understood that specific embodiments described herein are only used for explaining the present invention, not used for limiting the present invention. In addition, it shall be indicated that for ease of description, drawings only show some structures related to the present invention rather than all structures.

It should be indicated that terms "system" and "network" in the present disclosure are often used interchangeably herein. "And/or" mentioned in embodiments of the present invention refers to any and all combinations including one or more related listed items. Terms, such as "the first" and "the second", in the description, claims and drawings of the present invention are used for distinguishing different objects, rather than defining a specific sequence.

It should also be indicated that the following embodiments of the present invention can be executed independently, or in combination with each other, which is not specifically limited in embodiments of the present invention.

Figure 1:
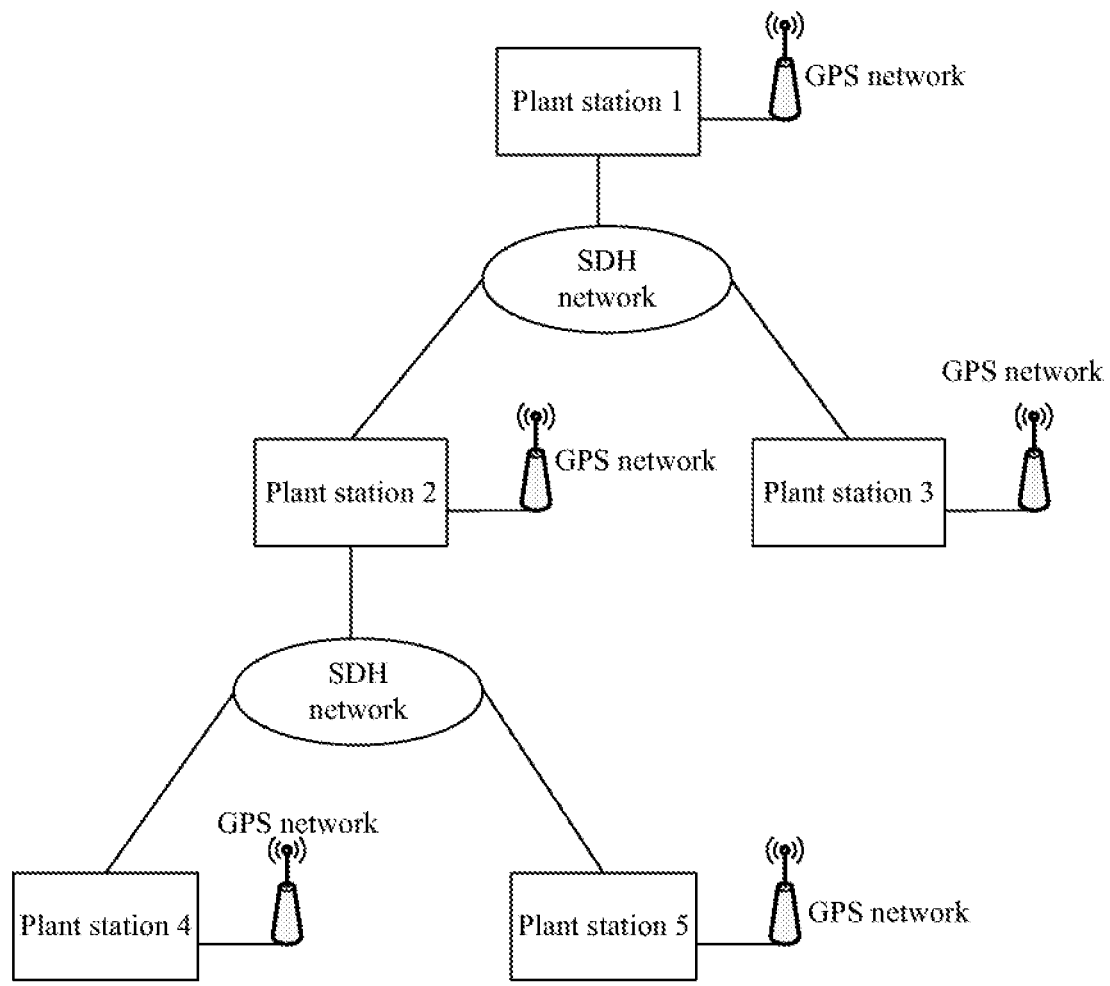
FIG. 1 is a schematic diagram illustrating a network topology framework of a wide area system protection apparatus according to an embodiment of the present invention.

FIG. 1 is a schematic diagram illustrating a network topology framework of a wide area system protection apparatus according to an embodiment of the present invention. The network topology framework of the wide area system protection apparatus includes at least two plant stations, each of which may be connected to a Global Positioning System (GPS) network respectively. FIG. 1 shows an example in which the network topology framework of the wide area system protection apparatus includes five plant stations. As show in FIG. 1, the above plant stations are classified into three levels, a plant station 1 is in the highest level, a plant station 2 and a plant station 3 are in the middle level, and a plant station 4 and a plant station 5 are in the lowest level. Data communication among the plant station 1, the plant station 2 and the plant station 3 is conducted through an SDH network. Since the plant station 1 is located at higher level than the plant station 2 and the plant station 3, a master-slave relation is presented between the plant station 1 and the plant station 2 and between the plant station 1 and the plant station 3, that is, the plant station 1 is a master plant station of the plant station 2, and the plant station 2 is a slave plant station of the plant station 1; and the plant station 1 is a master plant station of the plant station 3, and the plant station 3 is a slave plant station of the plant station 1. Similarly, data communication among the plant station 2, the plant station 4 and the plant station 5 is also conducted through the SDH network. Since the plant station 2 is located at higher level than the plant station 4 and the plant station 5, a master-slave relation is presented between the plant station 2 and the plant station 4 and between the plant station 2 and the plant station 5, that is, the plant station 2 is a master plant station of the plant station 4, and the plant station 4 is a slave plant station of the plant station 2; and the plant station 2 is a master plant station of the plant station 5, and the plant station 5 is a slave plant station of the plant station 2.

A clock of the master plant station may be referred to as a master clock, and a clock of the slave plant station may be referred to as a slave clock. The synchronization method of the wide area system protection apparatus in embodiments of the present invention may be applied at the slave plant station, that is, the master clock is taken as the benchmark, and the slave clock is adjusted to be synchronized with the master clock. Alternatively, the method may be applied to the slave plant station, that is, the master clock is adjusted to be synchronized with the slave clock. Therefore, embodiments of the present invention do not make specific limit to this.

The synchronization method and device of the wide area system protection apparatus, the plant station and technical effects thereof are described below in detail.

Figure 2:
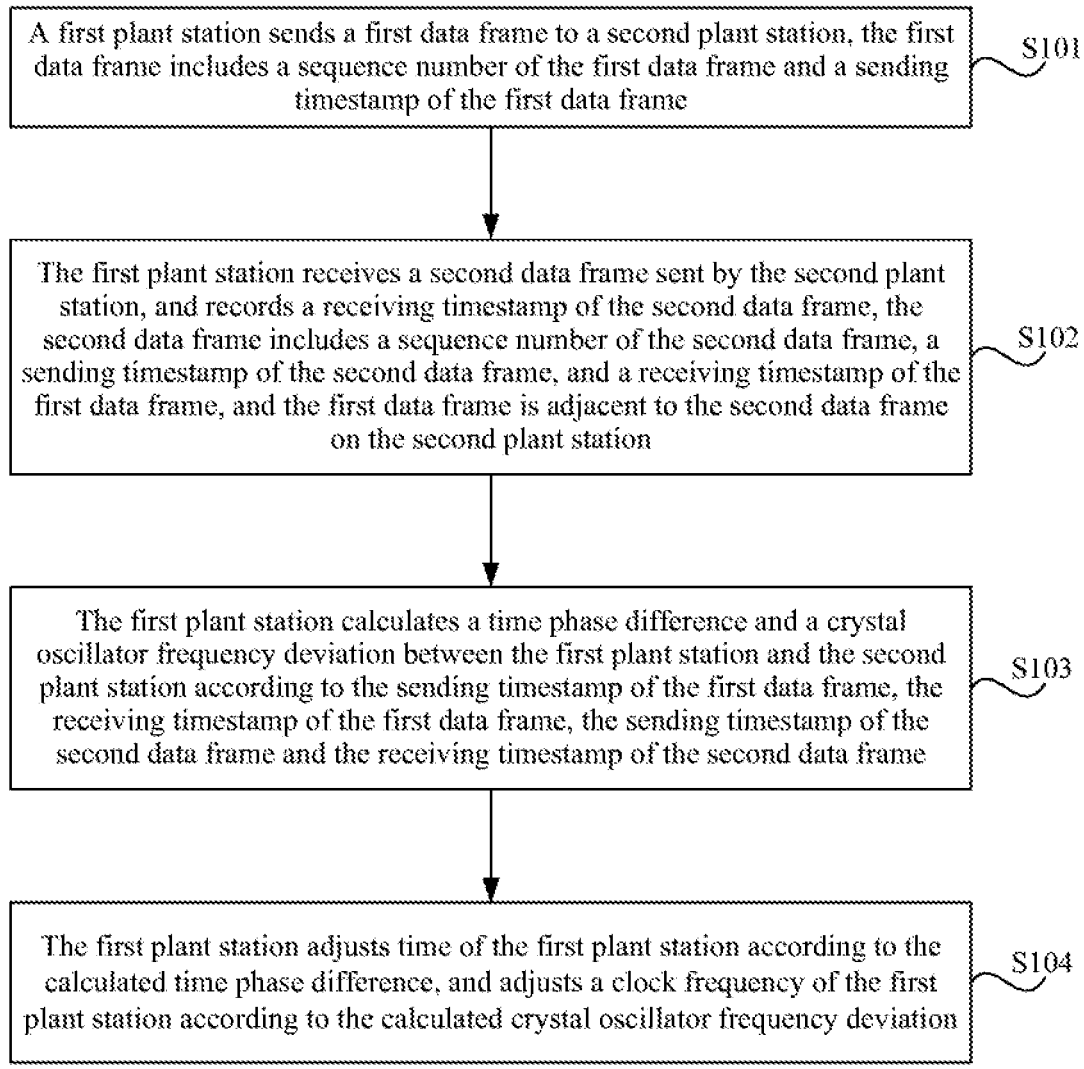
FIG. 2 is a flow chart illustrating a synchronization method of a wide area system protection apparatus according to an embodiment of the present invention.

FIG. 2 is a flow chart illustrating a synchronization method of a wide area system protection apparatus provided by an embodiment of the present invention. The method disclosed by embodiments of the present invention is applied to a first plant station. The first plant station may be any plant station in the network topology framework of the wide area system protection apparatus shown in FIG. 1. Exemplarily, if the first plant station is the plant station 2, the second plant station may be the plant station 1, the plant station 4 or the plant station 5. As shown in FIG. 2, the method may include the following steps.

In step S101, the first plant station sends a first data frame to the second plant station, and the first data frame at least includes a sequence number p of the first data frame and a sending timestamp $T_{st[p]}$ of the first data frame.

The synchronization method of the wide area system protection apparatus provided by embodiments of the present invention may use the master clock as the benchmark so that the slave clock is adjusted to be synchronized with the master clock. Alternatively, the slave clock may be used as the benchmark, and the master clock is adjusted to be synchronized with the slave clock. Therefore, the first plant station may be the master plant station, the second plant station may be the slave plant station; or, the first plant station may be the slave plant station, and the second plant station may be the master plant station.

After the first plant station and the second plant station are started, the first plant station and the second plant station may send data frames to each other according to a fixed frame length and a regular time interval. It should be noted that, the first plant station and the second plant station send and receive data frames through an SDH 2M channel, so as to ensure that the physical layer interface and code of a data link of communication transmission are unchanged.

Figure 3:
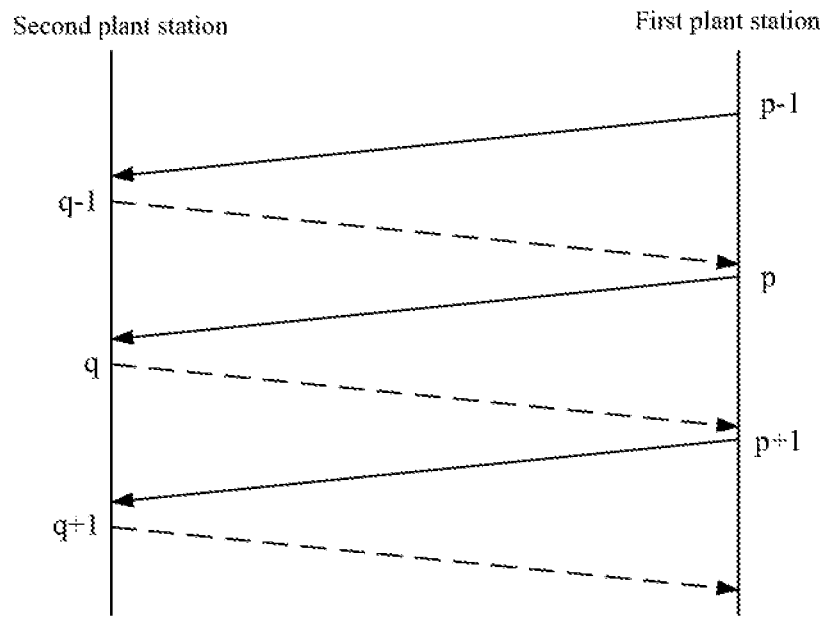
FIG. 3 is a schematic diagram illustrating data frame interaction of a first plant station and a second plant station according to an embodiment of the present invention.

FIG. 3 is a schematic diagram illustrating data frame interaction of the first plant station and the second plant station in an embodiment of the present invention. As shown in FIG. 3, the first plant station sends a data frame to the second plant station at a regular time interval, and the sequence numbers of the data frames are { . . . p−1, p, p+1, . . . }. Correspondingly, the second plant station also sends a data frame to the first plant station at a regular time interval, and the sequence numbers of the data frames are { . . . q−1, q, q+1, . . . }. Since the starting time of the first plant station and the starting time of the second plant station cannot be exactly the same, that is, the first plant station and the second plant station cannot be started simultaneously, the sequence numbers of the data frames sent by the first plant station and the sequence numbers of the data frames sent by the second plant station are in an asynchronous state. The time interval of the first plant station to send the data frame is the same as that of the second plant station, therefore, so, in theory, the first plant station and the second base station may receive a data frame from each other at each regular time interval.

The sequence numbers of the data frames may be limited to a certain range and reused. For example, the sequence number of the data frame is set within 0-99, totally 100 sequence numbers. When the amount of the data frames is greater than 100, the 0-99 are reused by the sequence numbers of the data frames. By acquiring the sequence number of a certain data frame, the first plant station and/or the second plant station may identify the sequence number of its' adjacent data frame.

Further, the data frame may further include a receiving timestamp of the previous received data frame and its own a sending timestamp. Specifically, the first plant station sends the first data frame to the second plant station at a regular time interval, and the first data frame includes the sequence number p of the first data frame, a sending timestamp $T_{st[p]}$ of the first data frame, and a receiving timestamp of the data frame with the sequence number of q−1.

In step S102, the first plant station receives a second data frame sent by the second plant station, and records the receiving timestamp $T_{sr[q]}$ of the second data frame. The second data frame includes a sequence number q of the second data frame, a sending timestamp $T_{mt[q]}$ of the second data frame, and a receiving timestamp $T_{mr[p]}$ of the first data frame, and the first data frame is adjacent to the second data frame on the second plant station.

As shown in FIG. 3, from perspective of the second plant station, the first data frame p is adjacent to the second data frame q. Therefore, the second plant station may record the receiving timestamp $T_{mr[p]}$ of the first data frame p, and write the receiving timestamp $T_{mr[p]}$ into the second data frame q, so that the second data frame received by the first plant station includes the sequence number q of the second data frame, the sending timestamp $T_{mt[q]}$ of the second data frame, and the receiving timestamp $T_{mr[p]}$ of the first data frame. Meanwhile, the first plant station may also record the receiving timestamp $T_{sr[q]}$ of the second data frame.

Therefore, under normal circumstances, the first plant station can collect a timestamp set $\{T_{st[p]}, T_{mr[p]}, T_{mt[q]}, T_{sr[q]}\}$ required for calculating a time phase difference and a crystal oscillator frequency deviation between the master plant station and the slave plant station at each time interval.

In step S103, the first plant station calculates a time phase difference $\Delta s$ and a crystal oscillator frequency deviation $\Delta f_p$ between the first plant station and the second plant station according to the sending timestamp $T_{st[p]}$ of the first data frame, the receiving timestamp $T_{mr[p]}$ of the first data frame, the sending timestamp $T_{mt[q]}$ of the second data frame and the receiving timestamp $T_{sr[q]}$ of the second data frame.

Specifically, the first plant station may calculate the time phase difference $\Delta s$ between the first plant station and the second plant station using the following formula:

$$\begin{cases} T_{mr[p]} = T_{st[p]} + \Delta s + T_{d[s \to m]} \\ T_{mt[q]} + T_{d[m \to s]} = T_{sr[q]} + \Delta s \end{cases};$$

By solving the above formula, the following equation may be obtained:

$$\Delta s = \frac{(T_{mr[p]} + T_{mt[q]}) - (T_{st[p]} + T_{sr[q]}) + (T_{d[m \to s]} - T_{d[s \to m]})}{2};$$

$T_{d[m \to s]}$ is a transmission delay from the second plant station to the first plant station, and $T_{d[s \to m]}$ is a transmission delay from the first plant station to the second plant station.

It should be noted that, the transmission delay $T_{d[m \to s]}$ from the second plant station to the first plant station is generally equal to the transmission delay $T_{d[s \to m]}$ from the first plant station to the second plant station and equal to a transmission delay $T_d$ between the first plant station and the second plant station. Therefore, the time phase difference is $$\Delta s = \frac{(T_{mr[p]} + T_{mt[q]}) - (T_{st[p]} + T_{sr[q]})}{2}.$$

In addition, the first plant station may also calculate the transmission delay $T_d$ between the first plant station and the second plant station, and the formula for calculating the transmission delay $T_d$ is:

$$T_d = \frac{(T_{mr[p]} + T_{sr[q]}) - (T_{st[p]} + T_{mt[q]})}{2}.$$

Since the precision of the time phase difference $\Delta s$ is strongly affected by whether an actual value of the transmission delay $T_{d[m \to s]}$ from the second plant station to the first plant station is strictly symmetrical with an actual value of the transmission delay $T_{d[s \to m]}$ from the first plant station to the second plant station. The calculation value of the time phase difference may vary greatly due to inconsistent time delays during link switching of the practical SDH network. Therefore, at the beginning of deployment of the system protection apparatus, the first plant station and the second plant station may obtain the currently reasonable and stable line delay by a GPS time synchronization method. The line delay is multiplied by an influence factor coefficient and used as a preset transmission delay $T_s$. Subsequently, during the time synchronization process after the first plant station is disconnected with the GPS network, the first plant station determines whether the transmission delay $T_d$ is less than or equal to the preset transmission delay $T_s$. If the transmission delay $T_d$ is greater than the preset transmission delay $T_s$, the first plant station discards the time phase difference Δs, thereby eliminating the influence of link switching and shake on time synchronization. If the transmission delay $T_d$ obtained by subsequently calculation is continuously greater than the preset transmission delay $T_s$, the normal adjustment may occur on the channel time delay, and clock synchronization logic is reentered upon confirmation of a communication administrator.

In addition, the timestamp set $\{T_{st[p]}, T_{mr[p]}, T_{mt[q]}, T_{sr[q]}\}$ can also be used for calculating a crystal oscillator frequency deviation $\Delta f_p$ between the first plant station and the second plant station, in addition to calculating a time phase difference Δs.

Specifically, a formula for calculating the crystal oscillator frequency deviation by first plant station $\Delta f_p$ is:

$$\Delta f_p = \frac{(T_{sr[q]} - T_{sr[q-T]}) - (T_{mt[q]} - T_{mt[q-T]})}{(T_{mt[q]} - T_{mt[q-T]})};$$

T is a period of calculating the crystal oscillator frequency deviation. The value of T may be obtained according to an adjustment period.

In an embodiment, the fluctuation in frequency adjustment may be excessively great and even the frequency divergence occurs, the synchronization failure occurs. In order to avoid such synchronization failure, in a specific process, the first plant station may store multiple frequency deviation values in a certain time window to calculate a mean crystal oscillator frequency deviation $\Delta f_{mean}$. The formula of calculating the mean crystal oscillator frequency deviation $\Delta f_{mean}$ includes:

$$\Delta f_{mean} = \left(\sum_{1}^{M} \Delta f_p\right) / M,$$

and M is a positive integer. In addition, the mean crystal oscillator frequency deviation $\Delta f_{mean}$ may be calculated by removing the maximum one and the minimum one of the multiple frequency deviation values, and calculating the average value of the remaining ones of the multiple frequency deviation values.

In step S104, the first plant station adjusts time of the first plant station according to the calculated time phase difference Δs, and adjusts a clock frequency of the first plant station according to the calculated crystal oscillator frequency deviation $\Delta f_p$.

The first plant station may adjust the time of the first plant station according to the time phase difference Δs, and adjust the clock frequency of the first plant station according to the crystal oscillator frequency deviation $\Delta f_p$ after calculating the time phase difference Δs and the crystal oscillator frequency deviation $\Delta f_p$, to realize the wide area time synchronization of the system protection apparatus.

In addition, if the mean crystal oscillator frequency deviation $\Delta f_{mean}$ is calculated in the step S103, the first plant station may adjust the clock frequency of the first plant station according to the mean crystal oscillator frequency deviation $\Delta f_{mean}$.

According to the synchronization method of a wide area system protection apparatus in embodiments of the present invention provide, the sending timestamp $T_{st[p]}$ of the first data frame, the receiving timestamp $T_{mr[p]}$ of the first data frame, the sending timestamp $T_{mt[q]}$ of the second data frame and the receiving timestamp $T_{sr[q]}$ of the second data frame are acquired by the first plant station, and the time phase difference Δs and the crystal oscillator frequency deviation $\Delta f_p$ between the first plant station and the second plant station are calculated; and the time of the first plant station is adjusted according to the time phase difference Δs, and the clock frequency of the first plant station is adjusted according to the crystal oscillator frequency deviation $\Delta f_p$. The timestamp information is obtained from interactions in the SDH 2M channel by means of the data frame and is independent of the GPS system, and an external clock source based on the SDH-based IEEE-1588 time synchronization system is not required. Therefore, the wide area time synchronization of the system protection apparatus is realized without changing the existing physical framework and channel configuration of the system protection apparatus, thereby saving the production cost.

Figure 4:
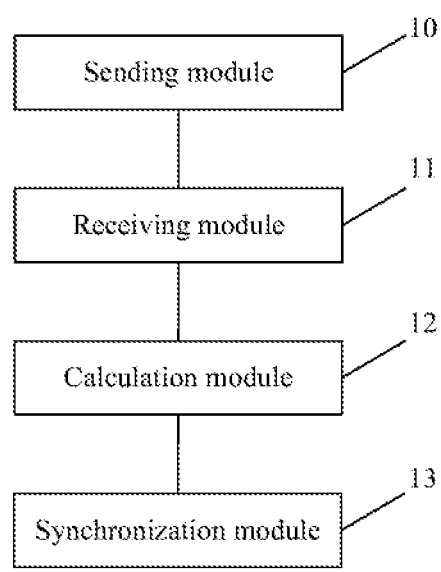
FIG. 4 is a structural schematic diagram illustrating a device having a wide area synchronization function according to an embodiment of the present invention.

FIG. 4 is a structural schematic diagram illustrating a device provided by an embodiment of the present invention and having a wide area synchronization function. Specifically, the device may be arranged in the first plant station described in above embodiments, and includes: a sending module 10, a receiving module 11, a calculation module 12 and a synchronization module 13.

The sending module 10 is configured to send a first data frame to a second plant station. The first data frame at least includes a sequence number p of the first data frame and a sending timestamp $T_{st[p]}$ of the first data frame.

The receiving module 11 is configured to receive a second data frame sent by the second plant station, and record a receiving timestamp $T_{sr[q]}$ of the second data frame. The second data frame includes a sequence number q of the second data frame, a sending timestamp $T_{mt[q]}$ of the second data frame and a receiving timestamp $T_{mr[p]}$ of the first data frame. The first data frame is adjacent to the second frame on the second plant station.

The calculating module 12 is configured to calculate a time phase difference Δs and a crystal oscillator frequency deviation M between the first plant station and the second plant station according to the sending timestamp $T_{st[p]}$ of the first data frame, the receiving timestamp $T_{mr[p]}$ of the first data frame, the sending timestamp $T_{mt[q]}$ of the second data frame and the receiving timestamp $T_{sr[q]}$ of the second data frame.

The synchronization module 13 is configured to adjust time of the first plant station according to the calculated time phase difference Δs and adjust a clock frequency of the first plant station according to the calculated crystal oscillator frequency deviation $\Delta f_p$.

In one or more embodiments, the formula for calculating the time phase difference Δs includes:

$$\Delta s = \frac{(T_{mr[p]} + T_{mt[q]}) - (T_{st[p]} + T_{sr[q]}) + (T_{d[m\to s]} - T_{d[s\to m]})}{2};$$

$T_{d[m\to s]}$ is a transmission delay from the second plant station to the first plant station, and $T_{d[s\to m]}$ is a transmission delay from the first plant station to the second plant station.

Figure 5:
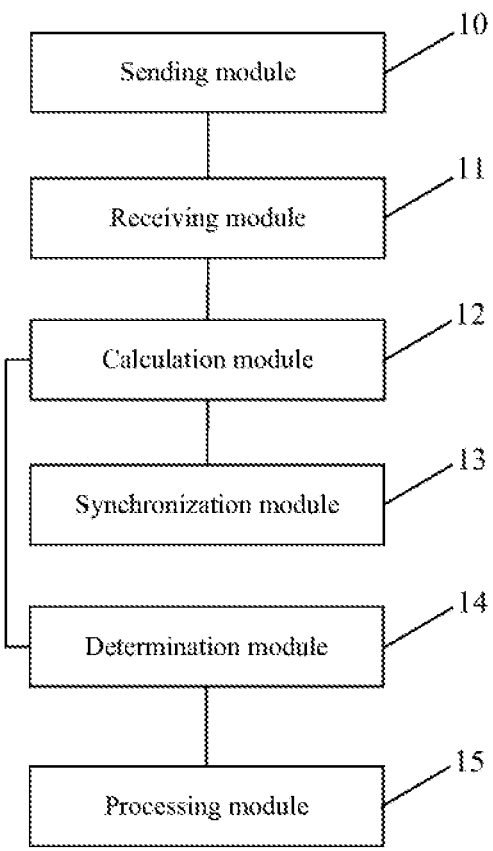
FIG. 5 is a structural schematic diagram illustrating another device having a wide area synchronization function according to an embodiment of the present invention.

In one or more embodiments, FIG. 5 is a structural schematic diagram illustrating another device provided by an embodiment of the present invention and having a wide area synchronization function. The device further includes: a determination module 14, and a processing module 15.

The calculation module 12 is further configured to calculate a transmission delay $T_d$ from the second plant station to the first plant station. The formula for calculating the transmission delay $T_d$ includes:

$$T_d = \frac{(T_{mr[p]} + T_{sr[q]}) - (T_{st[p]} + T_{mt[q]})}{2}.$$

The determination module 14 is configured to determine whether the transmission delay $T_d$ is less than or equal to a preset transmission delay $T_s$. The preset transmission delay $T_s$ is calculated by the first plant station using a GPS time synchronization method.

The processing module 15 is configured to discard the time phase difference Δs if the transmission delay $T_d$ is greater than the preset transmission delay $T_s$.

In one or more embodiments, the formula for calculating the crystal oscillator frequency deviation $\Delta f_p$ includes:

$$\Delta f_p = \frac{(T_{sr[q]} + T_{sr[q-T]}) - (T_{mt[q]} - T_{mt[q-T]})}{(T_{mt[q]} - T_{mt[q-T]})};$$

T is a period of calculating the crystal oscillator frequency deviation.

In one or more embodiments, the calculation module 12 is further configured to calculate a mean crystal oscillator frequency deviation $\Delta f_{mean}$, and the formula for calculating the mean crystal oscillator frequency deviation $\Delta f_{mean}$ includes:

$$\Delta f_{mean} = \left(\sum_1^M \Delta f_p\right)/M,$$

and M is a positive integer.

The synchronization module 13 is configured to adjust the clock frequency of the first plant station according to the mean crystal oscillator frequency deviation $\Delta f_{mean}$.

In one or more embodiments, the first plant station is a master plant station, the second plant station is a slave plant station; or, the first plant station is a slave plant station, and the second plant station is a master plant station.

In one or more embodiments, the calculation module 12 can calculate the time deviation and the crystal oscillator frequency deviation.

The device having the wide area synchronization function provided by embodiments of the present invention may execute the steps executed by the first plant station in the synchronization method of the wide area system protection apparatus provided by method embodiments of the present invention, and have corresponding functional module for executing the method and beneficial effects.

Figure 6:
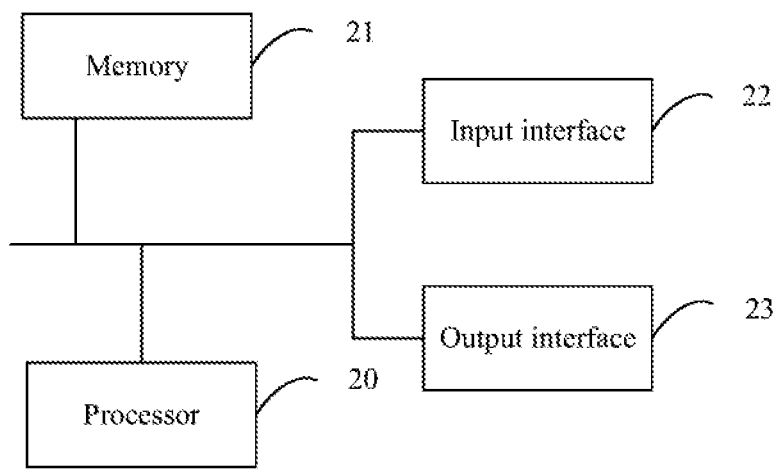
FIG. 6 is a structural schematic diagram illustrating a plant station according to an embodiment of the present invention.

FIG. 6 is a structural schematic diagram illustrating a plant station provided by an embodiment of the present invention. As shown in FIG. 6, the plant station includes a processor 20, a memory 21, an input interface 22 and an output interface 23. The plant station may include one or more processors 20, and FIG. 6 shows an example in which the plant station includes one processor 20. The processor 20, the memory 21, the input interface 22 and the output interface 23 in the plant station may be connected by a bus or other ways, and FIG. 6 shows an example in which they are connected by a bus. The bus includes one or more of: a memory bus or a memory controller, a peripheral bus, an accelerated graphics port, a processor or a local bus using any bus structure in several bus structures.

The memory 21, as a computer readable storage medium, may be used for storing a software program, a computer executable program and a module, such as a program instruction/module corresponding to the synchronization method of the wide area system protection apparatus in embodiments of the present invention. The processor 20 performs various function applications and data processing of the plant station by operating the software program, the instruction and the module stored in the memory 21, thereby realizing the synchronization method of the wide area system protection apparatus.

The memory 21 may mainly include a program storage region and a data storage area, wherein the program storage region may store an operating system and an application program required by at least one function; and the data storage region may store data created according to use of a terminal. In addition, the memory 21 may include a high-speed random access memory, and may also include a nonvolatile memory, such as at least one disk memory device, a flash memory device or other nonvolatile solid-state memory devices. In some instances, the memory 21 may further include memories remotely arranged relative to the processor 20, and the remote memories may be connected to the plant station through a network. An instance of the network includes, but not limited to, Internet, Intranet, a local area network, a mobile communication network and a combination thereof.

The input interface 22 may be used for receiving inputted digits or character information, and generating a key signal input related to user setting and function control of the plant station. The output interface 23 may include a display screen and other display devices.

Embodiments of the present invention further provide a network topology framework of a wide area system protection apparatus. The network topology framework includes a first plant station and a second plant station. The first plant station sends a data frame to the second plant station at a regular time interval, and the second plant station sends a data frame to the first plant station at a regular time interval. The first plant station includes the device having the wide area synchronization function as described by above embodiments.

Embodiments of the present invention further provide a computer readable storage medium which stores a computer program. The program, when executed by a processor, realizes the synchronization method of the wide area system protection apparatus described by above embodiments.

The computer storage medium of embodiments of the present invention may use any combination of one or more computer readable media. The computer readable medium may be a computer readable signal medium or a computer readable storage medium. The computer readable storage medium, for example, may be, but not limited to, a system, an apparatus or a device of electricity, magnetism, light, electromagnetism, infrared ray or semiconductor, or any combination thereof. More specific examples (non-exhaustive list) of the computer readable storage medium include: an electric connection of one or more wires, a portable computer hard disk, a hard disk, a random access memory (RAM), a read-only memory (ROM), an erasable programmable read-only memory (EPROM or a flash memory), an optical fiber, a portable compact disk read-only memory (CD-ROM), a light storage device, a magnetic storage device, or any proper combination thereof. Herein, the computer readable storage medium may be any tangible medium including or storing a program, and the program may be used by an instruction execution system, an apparatus or a device or used in a combination thereof.

The computer readable signal medium may be included in a baseband or be a data signal which is spread as a part of carrier, and carries a computer readable program code. Such spread data signal may adopt a plurality of forms, including but not limited to an electromagnetic signal, a light signal or any proper combination thereof. The computer readable signal medium may also be any computer readable medium other than the computer readable storage medium, and the computer readable medium may send, spread or transmit a program used by the instruction execution system, the apparatus or the device or in the combination thereof.

The program code included on the computer readable medium may be transmitted with any proper medium, including but not limited to wireless transmission, wire transmission, optical cable transmission, RF transmission, or any proper combination thereof.

The computer program code for executing the operation of the present invention may be written with one or more program design languages or a combination thereof. The program design language includes object-oriented program design languages, such as Java, Smalltalk and C++, and also includes conventional procedural program design languages, such as "C" language or similar program design languages. The program code may be completely executed on a user computer, partially executed on the user computer, executed as an independent software package, executed partially on the user computer or partially on a remote computer, or completely executed on the remote computer or a server. In case of the remote computer, the remote computer may be connected to the user computer through any kind of network, including a local area network (LAN) or a wide area network (WAN), or may be connected to an external computer (such as being connected through an Internet by means of an Internet service provider).

It should be noted that, the above only describes exemplary embodiments of the present invention and applied technical principles. Those skilled in the art shall understand that the present invention is not limited to specific embodiments described herein. For those skilled in the art, various apparent variations, readjustments and replacements can be made without departing from a protection scope of the present invention. Therefore, although the present invention is described in detail through the above embodiments, the present invention is not limited to the above embodiments and may further include more other equivalent embodiments without departing from the concept of the present invention, while the scope of the present invention is decided by a scope of attached claims.

What is claimed is:

1. A synchronization method, comprising:
at a wide area system protection apparatus, a network topology framework of which comprises a first plant station and a second plant station:
sending a first data frame to the second plant station by the first plant station, wherein the first data frame comprises a sequence number p of the first data frame and a sending timestamp $T_{st[q]}$ of the first data frame;
receiving, by the first plant station, a second data frame sent by the second plant station, and recording a receiving timestamp $T_{sr[q]}$ of the second data frame, wherein the second data frame comprises a sequence number q of the second data frame, a sending timestamp $T_{mt[q]}$ of the second data frame and a receiving timestamp $T_{mr[p]}$ of the first data frame, and the first data frame is adjacent to the second frame on the second plant station;
calculating, by the first plant station, a time phase difference $\Delta s$ and a crystal oscillator frequency deviation $\Delta f_p$ between the first plant station and the second plant station according to the sending timestamp $T_{st[p]}$ of the first data frame, the receiving timestamp $T_{mr[p]}$ of the first data frame, the sending timestamp $T_{mt[q]}$ of the second data frame and the receiving timestamp $T_{sr[q]}$ of the second data frame; and
adjusting, by the first plant station, time of the first plant station according to the calculated time phase difference $\Delta s$, and adjusting a clock frequency of the first plant station according to the calculated crystal oscillator frequency deviation $\Delta f_p$.

2. The method according to claim 1, wherein the time phase difference $\Delta s$ is calculated through the following formula:

$$\Delta s = \frac{(T_{mr[p]} + T_{mt[q]}) - (T_{st[p]} + T_{sr[q]}) + (T_{d[m \to s]} - T_{d[s \to m]})}{2};$$

wherein, $T_{d[m \to s]}$ is a transmission delay from the second plant station to the first plant station, and $T_{d[s \to m]}$ is a transmission delay from the first plant station to the second plant station.

3. The method according to claim 2, further comprising:
calculating a transmission delay $T_d$ from the first plant station to the second plant station by the first plant station, wherein the transmission delay $T_d$ is calculated through the following formula:

$$T_d = \frac{(T_{mr[p]} + T_{sr[q]}) - (T_{st[p]} + T_{mt[q]})}{2};$$

determining whether the transmission delay $T_d$ is less than or equal to a preset transmission delay $T_s$ by the first plant station, wherein the preset transmission delay $T_s$ is calculated by the first plant station with a GPS time synchronization method; and
discarding the time phase difference $\Delta s$ by the first plant station in response to determining that the transmission delay $T_d$ is greater than the preset transmission delay $T_s$.

4. The method according to claim 1, wherein the crystal oscillator frequency deviation $\Delta f_p$ is calculated through the following formula:

$$\Delta f_p = \frac{(T_{sr[q]} + T_{sr[q-T]}) - (T_{mt[q]} - T_{mt[q-T]})}{(T_{mt[q]} - T_{mt[q-T]})};$$

wherein T is a period for calculating the crystal oscillator frequency deviation $\Delta f_p$.

5. The method according to claim 4, further comprising: calculating a mean crystal oscillator frequency deviation $\Delta f_{mean}$ by the first plant station, wherein the mean crystal oscillator frequency deviation $\Delta f_{mean}$ is calculated through the following formula:

$$\Delta f_{mean} = \left(\sum_1^M \Delta f_p\right) / M,$$

wherein M is a positive integer,
wherein the adjusting the clock frequency of the first plant station according to the crystal oscillator frequency deviation $\Delta f_p$ comprises:
adjusting the clock frequency of the first plant station by the first plant station according to the mean crystal oscillator frequency deviation $\Delta f_{mean}$.

6. The method according to claim 1, wherein one of the first plant station and the second plant station is a master plant station, and the other one of the first plant station and the second plant station is a slave plant station.

7. A plant station, wherein the plant station is configured to implement the synchronization method according to claim 1.

8. A wide area system protection apparatus, comprising a first plant station and a second plant station,
wherein the first plant station is configured to: send a first data frame to the second plant station, wherein the first data frame comprises a sequence number p of the first data frame and a sending timestamp $T_{st[p]}$ of the first data frame;
receive a second data frame sent by the second plant station and record a receiving timestamp $T_{sr[q]}$ of the second data frame, wherein the second data frame comprises a sequence number q of the second data frame, a sending timestamp $T_{mt[q]}$ of the second data frame and a receiving timestamp $T_{mr[p]}$ of the first data frame, and the first data frame is adjacent to the second frame on the second plant station;
calculate a time phase difference $\Delta s$ and a crystal oscillator frequency deviation $\Delta f_p$ between the first plant station and the second plant station according to the sending timestamp $T_{st[p]}$ of the first data frame, the receiving timestamp $T_{mr[p]}$ of the first data frame, the sending timestamp $T_{mt[q]}$ of the second data frame and the receiving timestamp $T_{sr[q]}$ of the second data frame; and
adjust time of the first plant station according to the calculated time phase difference $\Delta s$, and adjust a clock frequency of the first plant station according to the calculated crystal oscillator frequency deviation $\Delta f_p$.

9. The wide area system protection apparatus according to claim 8, wherein the time phase difference $\Delta s$ is calculated through the following formula:

$$\Delta s = \frac{(T_{mr[p]} + T_{mt[q]}) - (T_{st[p]} + T_{sr[q]}) + (T_{d[m \to s]} - T_{d[s \to m]})}{2};$$

wherein, $T_{d[m \to s]}$ is a transmission delay from the second plant station to the first plant station, and $T_{d[s \to m]}$ is a transmission delay from the first plant station to the second plant station.

10. The wide area system protection apparatus according to claim 9, wherein the first plant station is further configured to:
calculate a transmission delay $T_d$ from the first plant station to the second plant station, wherein the transmission delay $T_d$ is calculated through the following formula:

$$T_d = \frac{(T_{mr[p]} + T_{sr[q]}) - (T_{st[p]} + T_{mt[q]})}{2};$$

determine whether the transmission delay $T_d$ is less than or equal to a preset transmission delay $T_s$ by the first plant station, wherein the preset transmission delay $T_s$ is calculated by the first plant station with a GPS time synchronization method; and
discard the time phase difference $\Delta s$ by the first plant station in response to determining that the transmission delay $T_d$ is greater than the preset transmission delay $T_s$.

11. The wide area system protection apparatus according to claim 8, wherein the crystal oscillator frequency deviation $\Delta f_p$ is calculated through the following formula:

$$\Delta f_p = \frac{(T_{sr[q]} + T_{sr[q-T]}) - (T_{mt[q]} - T_{mt[q-T]})}{(T_{mt[q]} - T_{mt[q-T]})};$$

wherein T is a period for calculating the crystal oscillator frequency deviation $\Delta f_p$.

12. The wide area system protection apparatus according to claim 11, wherein the first plant station is further configured to: calculate a mean crystal oscillator frequency deviation $\Delta f_{mean}$, wherein the mean crystal oscillator frequency deviation $\Delta f_{mean}$ is calculated through the following formula:

$$\Delta f_{mean} = \left(\sum_1^M \Delta f_p\right) / M,$$

wherein M is a positive integer,
wherein to adjust the clock frequency of the first plant station according to the crystal oscillator frequency deviation $\Delta f_p$ comprises:
adjust the clock frequency of the first plant station by the first plant station according to the mean crystal oscillator frequency deviation $\Delta f_{mean}$.

13. The wide area system protection apparatus according to claim 8, wherein one of the first plant station and the second plant station is a master plant station, and the other one of the first plant station and the second plant station is a slave plant station.

14. A non-transitory computer readable storage medium, storing a computer program, wherein the computer program, when executed by a processor, implements a synchronization method for a wide area system protection apparatus comprising a first plant station and a second plant station,
wherein the synchronization method comprises:
sending a first data frame to the second plant station by the first plant station, wherein the first data frame comprises a sequence number p of the first data frame and a sending timestamp $T_{st[q]}$ of the first data frame;
receiving, by the first plant station, a second data frame sent by the second plant station, and recording a receiving timestamp $T_{sr[q]}$ of the second data frame, wherein the second data frame comprises a sequence number q of the second data frame, a sending timestamp $T_{mt[q]}$ of the second data frame and a receiving timestamp $T_{mr[p]}$ of the first data frame, and the first data frame is adjacent to the second frame on the second plant station;
calculating, by the first plant station, a time phase difference Δs and a crystal oscillator frequency deviation $\Delta f_p$ between the first plant station and the second plant station according to the sending timestamp $T_{st[p]}$ of the first data frame, the receiving timestamp $T_{mr[p]}$ of the first data frame, the sending timestamp $T_{mt[q]}$ of the second data frame and the receiving timestamp $T_{sr[q]}$ of the second data frame; and
adjusting, by the first plant station, time of the first plant station according to the calculated time phase difference Δs, and adjusting a clock frequency of the first plant station according to the calculated crystal oscillator frequency deviation $\Delta f_p$.

15. The non-transitory computer readable storage medium according to claim 14, wherein the time phase difference Δs is calculated through the following formula:

$$\Delta s = \frac{(T_{mr[p]} + T_{mt[q]}) - (T_{st[p]} + T_{sr[q]}) + (T_{d[m \to s]} - T_{d[s \to m]})}{2};$$

wherein, $T_{d[m \to]}$ is a transmission delay from the second plant station to the first plant station, and $T_{d[s \to m]}$ is a transmission delay from the first plant station to the second plant station.

16. The non-transitory computer readable storage medium according to claim 15, wherein the method further comprises:
calculating a transmission delay $T_d$ from the first plant station to the second plant station by the first plant station, wherein the transmission delay $T_d$ is calculated through the following formula:

$$T_d = \frac{(T_{mr[p]} + T_{sr[q]}) - (T_{st[p]} + T_{mt[q]})}{2};$$

determining whether the transmission delay $T_d$ is less than or equal to a preset transmission delay $T_s$ by the first plant station, wherein the preset transmission delay $T_s$ is calculated by the first plant station with a GPS time synchronization method; and
discarding the time phase difference Δs by the first plant station in response to determining that the transmission delay $T_d$ is greater than the preset transmission delay $T_s$.

17. The non-transitory computer readable storage medium according to claim 16, wherein the method further comprises: calculating a mean crystal oscillator frequency deviation $\Delta f_{mean}$ by the first plant station through the following formula:

$$\Delta f_{mean} = \left(\sum_1^M \Delta f_p\right) / M,$$

wherein M is a positive integer,
wherein the adjusting the clock frequency of the first plant station according to the crystal oscillator frequency deviation $\Delta f_p$ comprises:
adjusting the clock frequency of the first plant station according to the mean crystal oscillator frequency deviation $\Delta f_{mean}$.

18. The non-transitory computer readable storage medium according to claim 14, wherein the crystal oscillator frequency deviation $\Delta f_p$ is calculated through the following formula:

$$\Delta f_p = \frac{(T_{sr[q]} + T_{sr[q-T]}) - (T_{mt[q]} - T_{mt[q-T]})}{(T_{mt[q]} - T_{mt[q-T]})};$$

wherein T is a period for calculating the crystal oscillator frequency deviation $\Delta f_p$.

19. The non-transitory computer readable storage medium according to claim 14, wherein one of the first plant station and the second plant station is a master plant station, and the other one of the first plant station and the second plant station is a slave plant station.

* * * * *